United States Patent [19]

Sakai et al.

[11] Patent Number: 5,496,798

[45] Date of Patent: Mar. 5, 1996

[54] SUPERCONDUCTING TUBE FOR SHIELDING MAGNETIC FIELDS

[75] Inventors: Hitoshi Sakai, Farmington Hills, Mich.; Hitoshi Yoshida, Okazaki, Japan

[73] Assignee: NGK Insulators, Ltd., Japan

[21] Appl. No.: 375,504

[22] Filed: Jan. 18, 1995

Related U.S. Application Data

[63] Continuation of Ser. No. 29,504, Mar. 11, 1993, abandoned.

[30] Foreign Application Priority Data

Mar. 17, 1992 [JP] Japan ................................. 4-060589

[51] Int. Cl.[6] .................................................. B32B 9/00
[52] U.S. Cl. ..................... 505/212; 505/701; 505/236; 505/237; 335/214; 428/688; 428/195; 428/930
[58] Field of Search ............................. 505/212, 213, 505/232, 236, 237, 238, 239, 844, 701, 702, 703, 704; 428/688, 689, 930, 209, 195; 335/214, 299

[56] References Cited

U.S. PATENT DOCUMENTS 4,218,712  8/1980  Clymer .................................. 335/214
4,613,820  9/1986  Edelstein ............................... 505/844
5,268,530 12/1993  Shimizu et al. ....................... 174/35 R

FOREIGN PATENT DOCUMENTS 0488790  6/1992  European Pat. Off. .

OTHER PUBLICATIONS

Patent Abstracts of Japan, vol. 015, No. 507 (P-1291) 20 Dec. 1991 & JP-A-32 20 491 (NKK Corp.) 27 Sep. 1991.
"Cuprate SC: Record 133K Achieved With Mercury" May 10, 1993, Coer pp. 4–5.
"Superconductors' Material Problems", Science vol. 240, Apr. 1, 1988, pp. 25–26.
"Path to Higher T. Superconductors", Geballe, Science vol. 259, Mar. 12, 1993 pp. 1550–1551.
Doss, "Engineer's Guide to High Tc Superconductivity" Wiley & Sons (1989) pp. 266–269.

Primary Examiner—Patrick J. Ryan
Assistant Examiner—Patrick Jewik
Attorney, Agent, or Firm—Parkhurst, Wendel & Rossi

[57] ABSTRACT

A superconducting tube for shielding magnetic fields including a substrate having a tubular wall, a superconducting layer supported by the substrate, and at least two ring-shaped reinforcing members connected to the radially-outer surface of the tubular wall.

15 Claims, 2 Drawing Sheets

SUPERCONDUCTING TUBE FOR SHIELDING MAGNETIC FIELDS

This is a Continuation of application Ser. No. 08/029,504 filed Mar. 11, 1993, now abandoned.

BACKGROUND OF THE INVENTION

The present invention relates to a superconducting tube for shielding magnetic fields, and, more particularly, to a large superconducting tube for shielding magnetic fields which is suitable for application to an apparatus for measuring magnetic fields of a human body and which assures reduced distortion when laid with its axis in the horizontal direction.

In recent years, research and development has been conducted on oxide superconductors having a high critical temperature, and practical application thereof has thus become realistic. It is well known that superconductors are capable of shielding magnetic fields due to the Meissner effect. Hence attempts have been made to apply oxide superconductors to magnetoencephalongraph (MEG) and nuclear magnetic resonance imaging.

In the application of the oxide superconductor to MEG, usually a large tube is used to accommodate a human body in a lying position inside the tube and to have entirely uniform superconductivity inside the tube without distortion. The oxide superconductor is generally formed on a metal substrate with a sufficient mechanical strength.

In the above-described superconducting tube for shielding magnetic field, a reduction in the entire load thereof is desirable for the ease of handling. This is conventionally achieved by the use of a relatively thin metal plate having a thickness of about 3 mm or less as the metal substrate.

However, since the magnetic-field-shielding superconducting tube is usually used with its axis laid in the horizontal direction, the use of a thin substrate readily deforms the tube in a radial direction thereof, thus generating a distortion in the superconducting layer formed on the substrate. As a result, the superconductivity inside the tube may not be homogeneous.

In order to prevent generation of such distortion, the thickness of the substrate may be increased. However, an increase in the thickness increases the weight of the tube, making handling of the tube difficult. Also, an increase in the thickness increases the distortion in the radial direction of the tube lying with its axis in the horizontal direction due to the weight of the tube, thus increasing the internal stress of the tube and thereby generating cracks in the superconducting layer on the substrate. As a result, the ability for shielding magnetic fields of the superconducting tube greatly deteriorates.

SUMMARY

In view of the aforementioned problems of the related arts, an object of the present invention is to provide a useful large superconducting tube for shielding magnetic fields which is (1) capable of preventing generation of distortion in the superconductivity of the tube without increasing the weight thereof, which distortion would occur when the tube is placed with its axis lying in the horizontal direction, (2) assures an entirely uniform superconducting state, and (3) maintains a stable ability for shielding magnetic fields.

To achieve the above-described object, the present invention provides a superconducting tube for shielding magnetic fields which includes at least a metal substrate and a superconducting layer. The superconducting layer formed on the metal substrate may constitute an inner surface of the tube. Preferably a reinforcing member is disposed such that an internal stress generated in the superconducting layer when the tube is placed with an axis thereof lying in a horizontal direction is less than 0.30 MPa and such that a reduction in the ability for shielding magnetic field in a temperature cycle is within a predetermined value.

Preferably the reinforcing members are disposed such that an increase in a magnetic flux density inside the superconducting tube at $-196°$ C. of the fifth temperature cycle is less than 5% of a magnetic flux density inside the tube at $-196°$ C. of the first temperature cycle wherein one temperature cycle consists of cooling the superconducting tube from room temperature to $-196°$ C. and warming the superconducting tube from $-196°$ C. to room temperature.

In the present invention, since the reinforcing member is disposed on the superconducting tube for shielding magnetic fields, the internal stress newly generated in the superconducting layer when the tube is placed with its axis lying in a horizontal direction can be reduced to a predetermined value or less. As a result, the magnetic field shielding ability of the tube can be maintained stably.

In the present invention, at least two ring members are disposed at predetermined intervals as the reinforcing members: so that generation of stress in the superconducting layer can be prevented; so that an increase in the weight can be restricted to a minimum value; and so that deformation of the tube, which would occur in the radial direction of the tube when the tube is placed with its axis lying in the horizontal direction, can be prevented.

DETAILED DESCRIPTION OF THE PREFERRED EMBODIMENTS

The present invention will now be described in detail.

The superconducting tube for shielding magnetic fields according to the present invention includes a metal substrate and a superconducting layer formed on the metal substrate. An intermediate layer made of a noble material such as silver, glass or ceramic may be formed between the metal substrate and the superconducting layer depending on the type of metal substrate and that of the superconducting layer. When the superconducting layer includes a reactive compound, such as a Bi superconductive oxide, with a metal substrate, an intermediate layer made of, for example, noble metal prevents a chemical reaction between the superconducting layer and the substrate.

The superconducting layer of the tube of the present invention consists essentially of a superconducting composition including a superconducting oxide. The superconducting oxide may have a critical temperature higher than a boiling point of liquid nitrogen, i.e., at $-196°$ C., and thus the superconducting layer may exhibit superconductivity at temperatures at and lower than $-196°$ C. Such a superconducting oxide may include Bi type oxide superconductors and rare earth type oxide superconductors.

Bi type superconductors having any composition can be used. For example, a Bi type superconductor includes such compounds as $Bi_2Sr_2CaCu_2O_x$ having a low critical temperature phase, i.e., a low Tc phase, and $Bi_2Sr_2Ca_2Cu_3O_x$ having a high Tc phase. Bi type superconductors may be a compound including lead (Pb) or antimony (Sb), a non-stoichiometric compound, and a compound in which the major elements are partially or totally replaced by other elements.

A perovskite type oxide which contains a rare earth element, such as $REBa_2Cu_3O_{7-y}$, may be used as the rare earth type oxide superconductor wherein RE is at least one element selected from the group consisting of Y, Sm, Eu, Dy, Ho, Er, and Yb and; y ranges from 0 to 1.

Figure 1:
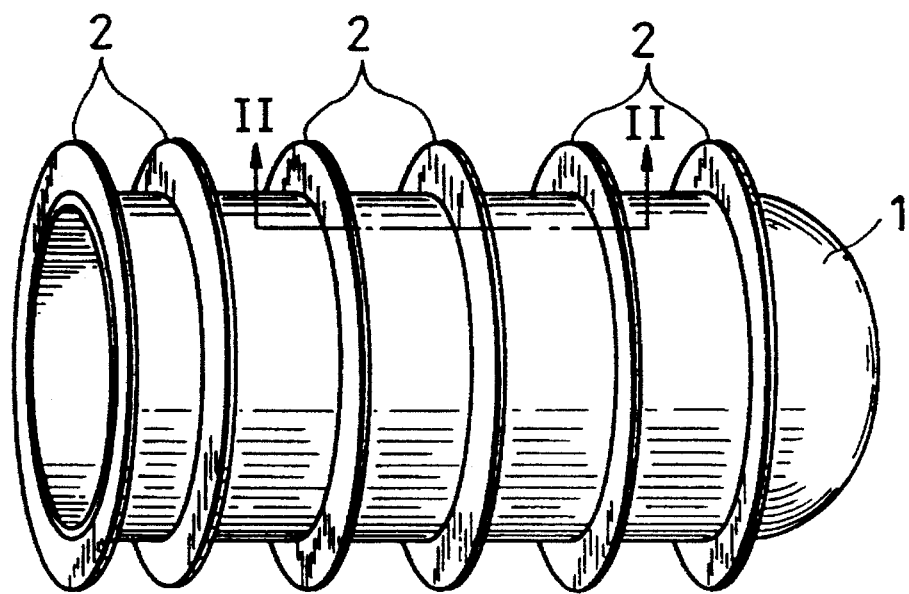
FIG. 1 is a perspective view of Example 1 of the present invention.

The substrate has a tubular wall, and the wall may have a generally-cylindrical shape. Preferably the substrate has one open end and one closed end. The closed end may have a shape of a cap protruded from the tubular wall, as shown in FIG. 1.

The tube substrate of the present invention is preferably made of metals exhibiting a sufficient mechanical strength and a high resistance to oxidation at high temperatures, because the formation of an oxide superconducting layer on the substrate requires firing in an oxygen atmosphere at about 880° C. or above. In addition, metals having a low brittleness at low temperatures are preferable, because the superconducting layer is made superconductive at a low temperature, such as that of liquid nitrogen.

Furthermore, metals having a thermal expansion coefficient close to that of the superconductor which forms the superconducting layer, such as a Bi type oxide superconductor or a rare earth type oxide superconductor, are preferably used as a substrate. Metals having a coefficient of thermal expansion slightly higher than that of the superconductor are more preferable. The use of a metal having a coefficient of thermal expansion which is not close to that of the superconducting layer generates a large internal stress in the superconducting tube during a temperature cycle, in which the temperature cycles between room temperature and low temperatures, such as liquid nitrogen temperature, thus peeling off the superconducting layer or generating cracks in the superconducting layer. The use of a metal having a coefficient of thermal expansion slightly higher than that of the superconducting layer changes the internal stress generated in the superconducting layer to a compressive stress, and is thus desirable for stable retention of the superconducting tube.

Suitable examples of metals for a substrate include a highly heat-resistant nickel alloy, such as Inconel, Incolloy and Hastelloy. However, Hastelloy is an expensive metal, and sufficiently strong austenite type stainless steels, such as SUS310 or SUS304, may also be used from the economical viewpoint depending on the type of superconductor which forms the superconducting layer. However, in a superconducting tube in which the superconducting layer is made of a Bi type superconductor, the use of austenite type stainless steel is undesirable, because the difference in the coefficient of thermal expansion between the Bi type superconductor and the austenite type stainless steel is large and the internal heat stress generated in the temperature cycle thus increases, reducing the reliability of the superconducting tube.

A reinforcing member according to the present invention is connected to the metal substrate which constitutes the superconducting tube for shielding magnetic fields. Preferably the reinforcing member is disposed such that the internal stress newly generated in the superconducting layer when the superconducting tube is laid with its axis extending in the horizontal direction, i.e., when the superconducting tube is laid horizontally, is less than 0.30 MPa, and more preferably less than 0.25 MPa. In a superconducting tube having a superconducting layer laminated on the metal substrate, a thermal stress is generated in the superconducting layer when the superconductive tube undergoes a wide temperature difference between the firing temperature for forming the superconductive layer and the liquid nitrogen temperature at which the superconducting layer shows superconductivity. Even when the superconducting layer is optimally formed onto the substrate, a stress of a few MPa generates. For practical application of the superconducting tube of the invention, a reduction of the transient stress newly generated in the superconducting tube during the cooling operation of the temperature cycle is desirable for reliability of the tube.

Thus, the reinforcing member is disposed such that the internal stress newly generated in the superconducting tube when the superconducting tube is laid horizontally is less than 0.30 MPa. Generation of a new internal stress exceeding 0.30 MPa when the superconducting tube is laid horizontally may make the superconducting layer superconductively unstable, and deteriorate the function of the superconducting tube. Generally, the reinforcing members have a shape of ring, and the reinforcing members are disposed on the outer side surface of the superconducting tube parallel to each other. Each ring of the reinforcing members having a ring shape shares its axis with a longitudinal axis of the cylindrical tube. The reinforcing members are disposed onto the tube such that the members are separated from each other by predetermined intervals in the axial direction of the tube.

An interval of the ring members preferably range from one half to one seventh and more preferably from one third to one fifth of the outer diameter of the tube. As explained above the reinforcing members prevent the generation of internal stress in the superconducting layer. Moreover, the reinforcing member supports the weight of the superconducting tube and thereby prevents a reduction in the ability for shielding magnetic fields due to the deformation of the substrate and due to the temperature cycle. When a part of the superconducting layer peels off or cracks form in the layer during the temperature cycle, magnetic fields outside the tube may leak into the tube though the defects.

Figure 2:
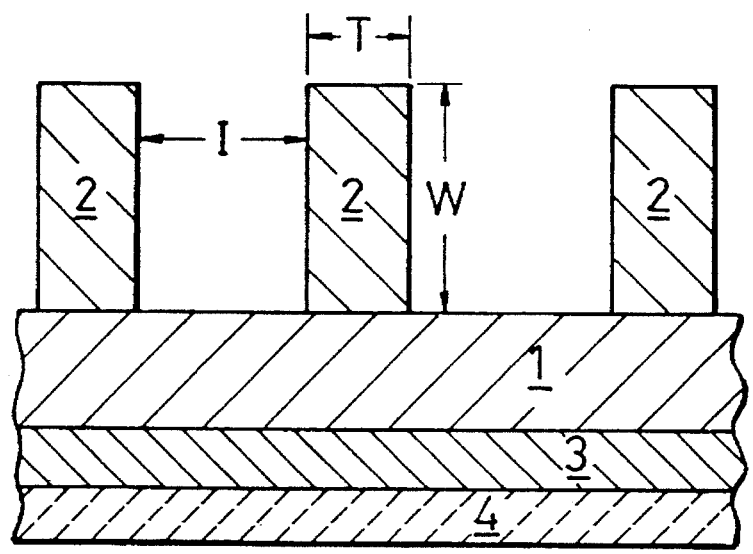
FIG. 2 is an enlarged cross-section taken along the line II—II of FIG. 1.

The prevention of these adverse effects may be achieved by adequately selecting the width and thickness of the ring member. The width and the thickness of the reinforcing members are indicated in FIG. 2. Generally, the lower limit of the thickness of the reinforcing member, which may be a ring member, is substantially the thickness of the metal substrate (which is 2 to 3 mm), and the upper limit thereof is about seven times that of the thickness of the metal substrate. Preferably the thickness of the reinforcing member is about one to five times of the thickness of the metal substrate.

The width of the reinforcing member may range from about 1/50th to 1/10th, and preferably about 1/30th to 1/10th of the outer diameter of the tube. In this way, a reduction in the ability for shielding magnetic fields can be restricted within about 5% after the temperature cycle between room temperature and liquid nitrogen has been repeated five times. This makes the practical application of the superconducting tube possible.

When the superconducting tube is subject to a temperature cycle between room temperature and −196° C. five times, an increase in a magnetic flux density inside the superconducting tube at −196° C. of the fifth temperature cycle is preferably less than 5%, more preferably less than 3% of a magnetic flux density inside the superconducting tube at −196° C. of the first temperature cycle.

A reinforcing member having a thickness of about 1 mm is too thin and undesirable, because it increases the stress applied to the reinforcing member, although it reduces the internal stress generated in the superconducting layer to 0.30 MPa. An increase in the stress applied to the reinforcing member gradually increases the residual magnetic field in the superconducting tube during the temperature cycle and thus reduces the ability of the superconducting tube to shield magnetic fields. A reinforcing member which is too thick makes the total weight of the reinforcing members 1000 kg or more, and is thus undesirable for handling.

The material of the reinforcing member is chosen considering its thermal expansion, the connection to the substrate, and an increase in the total weight of the superconducting tube. Though the use of the same metal as that of the metal substrate is desirable, the material for the reinforcing members is not restricted to it. As mentioned above, the less the total weight of the superconducting tube, the better for handling. Thus, an increase in the weight of the tube by the reinforcing members is preferably restricted to a smallest possible value. An increase in the weight may be restricted within four times the weight of the superconducting tube having no reinforcing members, and may be 1000 kg at most.

The reinforcing member is generally joined to the metal substrate by welding.

Alternatively the reinforcing members are integral to the metal substrate. The superconducting tube may be formed by combining and joining cylindrical members sharing the same axis, and a collar-shaped flange may be disposed at the joined portion to connect the cylindrical members. In this way, the flange works as the reinforcing members, and the reinforcing member can be formed continuously with the metal substrate.

In the superconducting tube for shielding magnetic fields according to the present invention, the reinforcing members are disposed in the manner described above in order to restrict the internal stress generated in the superconducting layer when the superconducting tube is used with its axis laid in the horizontal direction. This invention can be suitably applied particularly to a large superconducting tube for shielding magnetic field which has an outer diameter R of 0.5 m or more and in which a ratio L/R of the outer diameter R to a longitudinal length L is about 2 or more.

EXAMPLES

Examples of the present invention will be described below in detail. The present invention is not limited to these examples.

Examples 1–6 and Comparative Examples 1–7

In each of the examples, an Ag foil having a thickness of 0.5 mm was laminated on an Inconel plate having a thickness of 2 mm to prepare a laminated member. These laminated members were connected by welding, and then pressed to form a laminated tube having one open end and one closed end in which the Ag layer was located on the inner side of tube. The obtained tube had a diameter of 900 mm and a length of 3000 mm.

Inconel ring members having a width and a thickness shown in Table 1 were welded to the outer periphery of the manufactured tube parallel to each other at intervals shown in Table 1.

Next, a slurry obtained by kneading calcined $Bi_2Sr_2Ca_1Cu_2O_x$ powders with ethanol was coated by spraying on the inner surface of the tube to form a Bi type calcined powder layer. After the coated powder layer was dried, the tube was fired by an electric furnace for 30 minutes at 890° C. in the pure oxygen atmosphere and then gradually cooled to 830° C. at a cooling rate of 1° C./min. Thereafter, the tube was heat treated for 15 hours at 830° C., and then gradually cooled to 700° C. at a cooling rate of 1° C./min.

When the furnace temperature lowered to 700° C., the atmosphere in the electric furnace was replaced by nitrogen atmosphere and the tube was then furnace cooled to obtain a superconducting tube for shielding magnetic fields which had one end closed with a cap, which comprised the metal substrate, the Ag layer laminated on the metal substrate and the Bi type superconducting layer laminated on the Ag layer. The metal substrate was on the outermost side of the tube both in the wall and the bottom cap, and had a plurality of ring-shaped reinforcing members on the outer peripheral surface thereof.

FIG. 1 is a perspective view of the thus-obtained magnetic-field-shielding tube. FIG. 2 is an enlarged cross-section taken along the line II—II of FIG. 1.

In FIG. 1, Inconel ring-shaped reinforcing members 2 are welded to the outer peripheral surface of the bottomed Inconel cylindrical metal substrate 1.

In FIG. 2, an Ag layer 3 was laminated on the inner side of the Inconel base 1, and a Bi type superconducting layer 4 was laminated on the inner side of the Ag layer. The Inconel reinforcing members 2, each having a thickness T and a width W, are welded to the outer side of the Inconel base 1 at intervals I.

The inner stress generated in the Bi type superconducting layer of the superconducting tube thus made (having a closed end and having the reinforcing members) laid horizontally was calculated by the finite element method. The results of the calculations are shown in Table 1. The total weight of the reinforcing members in each of the tubes is also listed in Table 1.

TABLE 1

| | reinforcing member | | | total weight of | maximum internal pressure generated in the | result of |
| --- | --- | --- | --- | --- | --- | --- |
| | width (mm) | thickness (mm) | interval (mm) | the reinforcing member (kg) | superconducting layer (MPa) | temp. cycle (%) |
| EXAMPLE | | | | | | |

TABLE 1-continued

|   | reinforcing member | | | total weight of the reinforcing member (kg) | maximum internal pressure generated in the superconducting layer (MPa) | result of temp. cycle (%) |
|---|---|---|---|---|---|---|
|   | width (mm) | thickness (mm) | interval (mm) | | | |
| 1 | 45 | 2 | 200 | 135 | 0.05 | 1 |
| 2 | 45 | 4 | 200 | 270 | 0.16 | 1 |
| 3 | 45 | 10 | 200 | 675 | 0.16 | 3 |
| 4 | 45 | 5 | 500 | 135 | 0.24 | 4 |
| 5 | 45 | 5 | 200 | 675 | 0.16 | 1 |
| 6 | 20 | 5 | 200 | 145 | 0.24 | 1 |
| 7 | 90 | 5 | 200 | 710 | 0.12 | 3 |
| COMPARATIVE EXAMPLE | | | | | | |
| 1 | None | None | None | 0 | 1.2 | 27 |
| 2 | 45 | 1 | 200 | 70 | 0.03 | 12 |
| 3 | 45 | 20 | 200 | 1350 | 0.17 | 10 |
| 4 | 45 | 5 | 150 | 1010 | 0.33 | 10 |
| 5 | 10 | 5 | 200 | 70 | 0.31 | 17 |
| 6 | 180 | 5 | 200 | 1550 | 0.09 | 11 |

Figure 3:
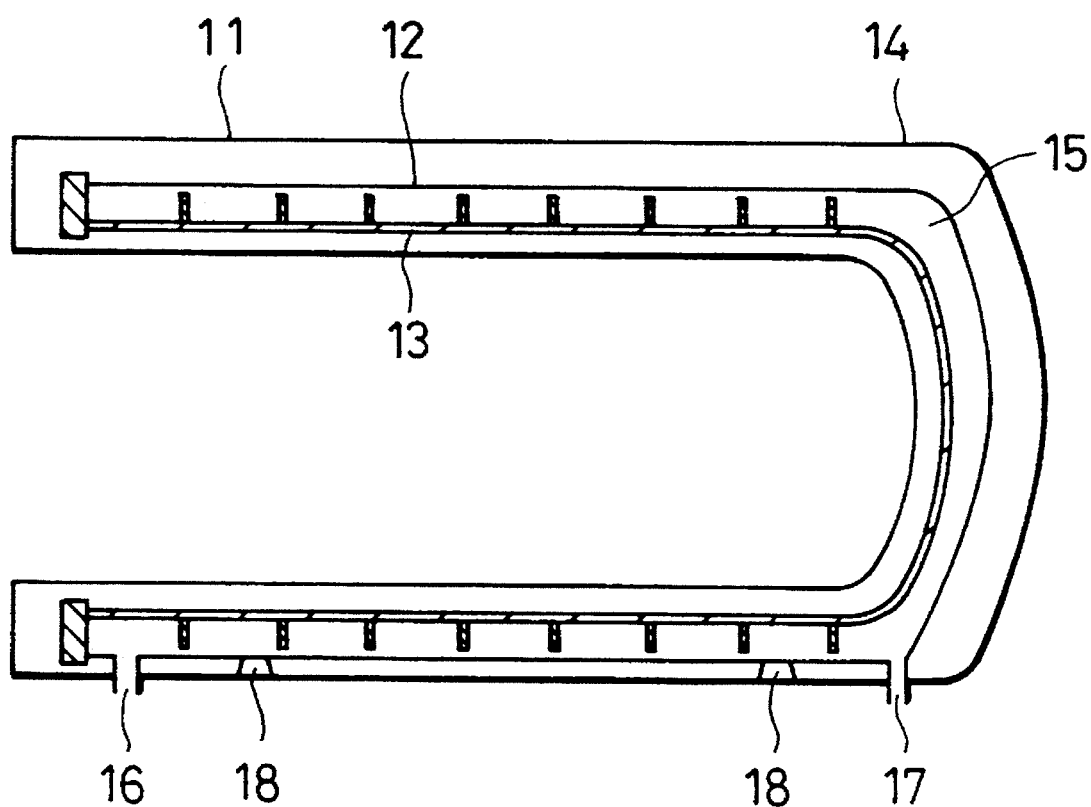
FIG. 3 schematically illustrates a magnetic-field-shielding device which employs the example of the present invention.

FIG. 3 schematically illustrates a device for shielding magnetic field in which a liquid nitrogen cooling container with the tube for shielding magnetic fields incorporated therein is assembled in a vacuum container.

In FIG. 3, a magnetic-field-shielding tube 13 obtained in the manner described above was placed in a liquid nitrogen chamber 12, and the liquid nitrogen chamber 12 was placed in a vacuum container 11 on retaining bases 18. After a predetermined position was welded, an interior 14 of the vacuum container was evacuated to obtain a magnetic-field-shielding device. Liquid nitrogen was introduced into the liquid nitrogen chamber 12 from liquid nitrogen ports 16 and 17 to fill an interior 15 of the liquid nitrogen chamber with liquid nitrogen. The magnetic-field-shielding tube was cooled to make it superconductive.

A flux meter using superconducting quantum interference device (SQUID) was set at a place close to and inside the protruded cap of the tube to measure a magnetic flux density of the place. At the same time a coil is provided at the radially-outer surface of the vacuum container. During the measurement of a magnetic flux density inside the tube, alternating current in a range of 0.5 to 1000 Hz was applied to the tube so that the radially outer surface of the tube had magnetic field about 20 gauss. The magnetic flux density of the place value was found to $10^{-13}$ tesla/$\sqrt{Hz}$ or less.

Subsequently, liquid nitrogen in the interior 15 of the liquid nitrogen chamber 12 was drained from the liquid nitrogen ports 16 and 17, and the device was stood until it reached a room temperature. Thereafter, liquid nitrogen was introduced again, the tube for shielding magnetic field was cooled again to make it superconductive, and the magnetic flux density of the same place was measured by the SQUID flux meter. A temperature cycle in which the tube is subject to a temperature change between the liquid nitrogen temperature and the room temperature, was repeated in the manner described above 5 times.

The increase (I) in percentage in the magnetic flux density ($D_5$) at a place close to and inside the protruded cap of the tube in liquid nitrogen at the fifth time of the temperature cycle compared to the magnetic flux density ($D_1$) of the same place in liquid nitrogen at the first time of the temperature cycle is shown in Table 1 as the result of temperature cycle, and the increase I is expressed as follow:

$$I(\%)=\{(D_5-D_1)/D_1\}\times 100.$$

As shown in Table 1, when each of the reinforcing members had a thickness (T) of 2 to 10 mm and a width (W) of 20 to 90 mm and when the reinforcing members were separated from each other by intervals (I) of 200 to 450 mm, the total weight of the reinforcing members was less than 1000 kg, and the internal stress generated in the superconducting layer was less than 0.30 MPa.

In the comparative examples, when the intervals of the reinforcing members were small, the total weight of the reinforcing members exceeded 1000 kg, which was undesirable for handling. When the intervals were too large, the internal stress generated in the superconducting layer exceeded 0.30 MPa. Also, the increases in the magnetic flux density at the fifth temperature cycle are larger than those of the tube of working examples. When the thickness of each of the reinforcing members was 1 mm or less, the stress which acted on the reinforcing members in the temperature cycles increased, increasing the magnetic flux density after the temperature cycles, though the internal stress generated in the superconducting layer was less than 0.30 MPa. When the thickness of each of the reinforcing members was 20 mm or more, the total weight of the reinforcing members exceeded 1000 kg, which was undesirable for handling.

When the width of each of the reinforcing members was 10 mm or less, the internal stress generated in the superconducting layer was 0.30 MPa or more, which was undesirable.

As will be understood from the foregoing description, in the superconducting tube for shielding magnetic field according to the present invention, no stress is newly loaded to the superconducting layer when the tube is placed with its axis lying in the horizontal direction, and an increase in the total weight thereof is restricted to a minimum value, which assures easy handling.

What is claimed is:

1. A superconducting tube for shielding a magnetic field, comprising:

a substrate comprising a tubular wall having radially inner and radially outer surfaces;

an intermediate layer disposed radially inwardly of said substrate and comprising a noble material;

a superconducting layer uniformly disposed radially inwardly of said intermediate layer, said superconducting layer consisting essentially of a superconducting oxide comprising a material selected from the group consisting of (i) a Bismuth compound containing Sr, Ca, Cu and O, and (ii) $REBa_2Cu_3O_{7-y}$, wherein RE is at least one element selected from the group consisting of Y, Sm, Eu, Dy, Ho, Er and Yb, and y ranges from 0 to 1; and at least two ring-shaped reinforcing members welded to the radially outer surface of said tubular wall, each of said reinforcing members having a thickness of about 1 to 7 times a thickness of said tubular wall;

wherein said intermediate layer prevents a reaction between said substrate and said superconducting layer.

2. The superconducting tube of claim 1, wherein said substrate comprises a material selected from the group consisting of heat-resistant nickel alloy and stainless steel.

3. The superconducting tube of claim 2, wherein said nickel alloy is selected from the group consisting of Inconel, Incolloy and Hastelloy.

4. The superconducting tube of claim 2, wherein said stainless steel is selected from the group consisting of SUS310 and SUS304.

5. The superconducting tube of claim 1, wherein said reinforcing members are disposed on said outer surface of said tubular wall such that an internal stress generated in said superconducting layer by orienting said superconducting tube with a longitudinal axis thereof in a horizontal direction is less than 0.30 MPa.

6. The superconducting tube of claim 5, wherein said internal stress is less than 0.25 MPa.

7. The superconducting tube of claim 1, wherein said reinforcing members are disposed on said outer surface of said tubular wall such that an increase in a magnetic flux density inside said superconducting tube at −196° C. of a fifth temperature cycle is less than 5% of a magnetic flux density inside said tube at −196° C. of a first temperature cycle, wherein one temperature cycle consists of cooling said superconducting tube to −196° C. and then allowing said tube to warm to ambient room temperature.

8. The superconducting tube of claim 7, wherein said increase in magnetic flux density is less than 3%.

9. The superconducting tube of claim 1, wherein each of said reinforcing members has a thickness of about 1 to 5 times a thickness of said tubular wall.

10. The superconducting tube of claim 1, wherein each of said reinforcing members has a radial width about 1/50 to 1/10 of an outer diameter of said tubular wall.

11. The superconducting tube of claim 1, wherein spacing between adjacent reinforcing members is 1/7 to 1/2 of an outer diameter of said tubular wall.

12. The superconducting tube of claim 1, wherein said noble material is selected from the group consisting of silver, glass and ceramic.

13. The superconducting tube of claim 1, wherein each of said ring-shaped reinforcing members is a separate unitary structure.

14. The superconducting tube of claim 10, wherein each of said reinforcing members has a radial width about 1/30 to 1/10 of an outer diameter of said tubular wall.

15. The superconducting tube of claim 1, wherein said Bismuth compound is one of $Bi_2Sr_2CaCu_2O_x$ and $Bi_2Sr_2Ca_2Cu_3O_x$.

* * * * *